(12) United States Patent
Kim et al.

(10) Patent No.: US 8,946,869 B2
(45) Date of Patent: Feb. 3, 2015

(54) INTEGRATED CIRCUIT FOR DETECTING DEFECTS OF THROUGH CHIP VIA

(75) Inventors: Dae-Suk Kim, Gyeonggi-do (KR);
Jong-Chern Lee, Gyeonggi-do (KR);
Chul Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 594 days.

(21) Appl. No.: 13/041,003

(22) Filed: Mar. 4, 2011

(65) Prior Publication Data

US 2012/0153280 A1    Jun. 21, 2012

(30) Foreign Application Priority Data

Dec. 17, 2010    (KR) .......................... 10-2010-0130120

(51) Int. Cl.
| | | |
|---|---|---|
| H01L 29/00 | (2006.01) | |
| H01L 29/80 | (2006.01) | |
| H01L 23/48 | (2006.01) | |
| H01L 21/66 | (2006.01) | |
| G01R 31/28 | (2006.01) | |
| H01L 23/00 | (2006.01) | |

(52) U.S. Cl.
CPC ............ *H01L 22/34* (2013.01); *G01R 31/2853* (2013.01); *H01L 23/481* (2013.01); *G01R 31/2884* (2013.01); *H01L 24/05* (2013.01); *H01L 2225/06544* (2013.01); *H01L 2225/06596* (2013.01)
USPC ........... 257/621; 257/276; 257/774; 257/696; 257/E23.141

(58) Field of Classification Search
CPC .................. H01L 23/481; H01L 22/34; H01L 2225/06541; H01L 21/76898; H01L 22/00; H01L 23/49827; H01L 23/5384
USPC .......... 257/686, 698, 774, 276, 621, E23.141; 324/750.3, 606; 438/667
See application file for complete search history.

(56) References Cited

U.S. PATENT DOCUMENTS

| | | | |
|---|---|---|---|
| 7,883,938 B2 * | 2/2011 | Kolan et al. ................. | 438/109 |
| 8,242,606 B2 * | 8/2012 | Seo et al. .................... | 257/774 |
| 8,384,201 B2 * | 2/2013 | Chen et al. ................. | 257/686 |
| 2007/0152280 A1 * | 7/2007 | Lee et al. .................... | 257/371 |

(Continued)

FOREIGN PATENT DOCUMENTS

| | | |
|---|---|---|
| JP | 2008-096312 | 4/2008 |
| JP | 2009139273 | 6/2009 |
| JP | 2009158764 | 7/2009 |
| KR | 100363530 | 12/2002 |

OTHER PUBLICATIONS

Office Action issued by the Korean Intellectual Property Office on Jun. 19, 2012.

(Continued)

*Primary Examiner* — Shouxiang Hu
(74) *Attorney, Agent, or Firm* — IP & T Group LLP

(57) ABSTRACT

An integrated circuit that detects whether a through silicon via has defects or not, at a wafer level. The integrated circuit includes a semiconductor substrate, a through silicon via configured to be formed in the semiconductor substrate to extend to a certain depth from the surface of the semiconductor substrate, an output pad, and a current path providing unit configured to provide a current, flowing between the semiconductor substrate and the through silicon via, to the output pad during a test mode.

8 Claims, 4 Drawing Sheets

(56) References Cited

U.S. PATENT DOCUMENTS

| | | | |
|---|---|---|---|
| 2009/0315147 A1* | 12/2009 | Saito et al. | 257/598 |
| 2011/0080184 A1* | 4/2011 | Wu et al. | 324/750.3 |
| 2011/0080185 A1* | 4/2011 | Wu et al. | 324/750.3 |
| 2012/0025846 A1* | 2/2012 | Minas et al. | 324/606 |

OTHER PUBLICATIONS

Notice of Allowance issued by the Korean Intellectual Property Office on Dec. 14, 2012.

* cited by examiner

INTEGRATED CIRCUIT FOR DETECTING DEFECTS OF THROUGH CHIP VIA

CROSS-REFERENCE TO RELATED APPLICATIONS

The present application claims priority of Korean Patent Application No. 10-2010-0130120, filed on Dec. 17, 2010, which is incorporated herein by reference in its entirety.

BACKGROUND

1. Field

Exemplary embodiments of the present invention relate to a semiconductor design technique, and more particularly, to an integrated circuit including a through chip via.

2. Description of the Related Art

Technology for packaging a semiconductor integrated circuit has been developed to satisfy the need for reliable, small-sized packaging. Particularly, various technologies regarding stack packaging have developed recently in response to the demand for the miniaturization and high performance of electrical/electronic devices.

A 'stack package' in the semiconductor technology field refers to a device that has two or more chips or packages stacked in a vertical direction. By implementing a stack package, it may be possible to form a semiconductor memory device with a capacity that has more than twice the capable memory capacity achieved through a typical semiconductor integration process. Because of the advantages of the stack package with respect to memory capacity, package density, and package size, research and development of the stack package has accelerated.

A stack package may be formed by stacking semiconductor chips, and then packaging the stacked semiconductor chips. Alternatively, the stack package may be formed by first packaging semiconductor chips, and then stacking the packaged semiconductor chips. The respective semiconductor chips in the stack package are electrically connected to each other through a metal wire or a through chip via such as a through silicon via (hereinafter referred to "TSV"). The stack package using a TSV has a structure such that semiconductor chips are physically and electrically connected to each other in a vertical direction by a TSV formed within a semiconductor substrate. The stack package, including a TSV, can reduce power consumption and signal delay, and increase an operation performance due to the increased bandwidth available for interfacing signals and power through the TSV.

FIG. 1 is a cross-sectional view illustrating a related integrated circuit including a TSV. For convenience, an integrated circuit including only one TSV is illustrated and described.

Referring to FIG. 1, an integrated circuit 10 includes a semiconductor substrate 12, TSV 14, and an isolation layer 16. The semiconductor substrate 12 is doped by a P-type impurity. TSV 14 is vertically formed and filled in the semiconductor substrate 12, such that the TSV 14 extends to a predetermined depth from the surface of the semiconductor substrate 12. The isolation layer 16 surrounds sidewalls of the TSV 14 to isolate the TSV 14 from the semiconductor substrate 12.

Herein, a manufacturing process of the integrated circuit 10 will be described. First, a hole is formed within the substrate 12. Next, the isolation layer 16 is formed along sidewalls of the hole. Then, a TSV 14 is formed by filling the remaining hole having the isolation layer 16 along the sidewalls. Finally, a grinding operation is performed onto the back side of the semiconductor substrate 12 until the back side of TSV 14 is exposed, so as to complete a semiconductor chip for the stack package. Accordingly, semiconductor chips manufactured as described above are stacked to form the stack package.

However, the conventional integrated circuit 10 may have disadvantages as discussed below.

First, before discussing the disadvantages of the conventional integrated circuit 10, TSV defects, which may occur during the insertion process of the TSV 14, are described.

FIGS. 2A and 2B illustrate examples of defects occurring in the TSV 14 shown in FIG. 1. Here, to say that the TSV 14 has defects means that the TSV 14 formed in the semiconductor substrate 12 is formed abnormally. The defects may occur depending on a process scheme, a process environment, the material used for the TSV 14, and so on.

For example, as shown in FIG. 2A, the TSV 14 may be formed without conforming to the surface of the semiconductor substrate 12. More specifically, a portion EM1 may occur over the TSV 14 because the TSV 14 does not fill the hole. That is, instead of being even with the surface of the semiconductor substrate 12, the TSV 14 may only be filled to a height below the surface of the semiconductor substrate 12. Due to this, circuits formed in an active region (not shown) of the semiconductor substrate 12 may not be connected to the TSV 14 through a conductive line. Accordingly, signals or power interfaced through the TSV 14 may not be provided to certain circuits.

Furthermore, as shown in FIG. 2B, the TSV 14 may be formed with one or more empty intermediate portions EM2. That is, the TSV 14 may not uniformly and smoothly fill the hole in the semiconductor substrate 12. Due to this, the resistance of the TSV 14 may increase. Accordingly, signals or power interfaced through the TSV 14 may not be provided properly to certain circuits.

As described above, TSV defects may occur during the formation process of the TSV 14 at a wafer level. However, only at a package level, occurring after the wafer level, is it possible to detect whether the TSV 14 has defects or not. At the package level, although defects of the TSV 14 are detected, no appropriate solutions currently exist to cure the defects. Furthermore, even if appropriate solutions did exist, additional costs and time would be needed to implement the solutions. Accordingly, it is desirable to detect whether TSV 14 has defects or not at the wafer level, instead of at the package level.

SUMMARY

Exemplary embodiments of the invention are directed to an integrated circuit which detects whether a through chip via has defects or not at a wafer level.

In accordance with an exemplary embodiment of the invention, an integrated circuit includes a semiconductor substrate, a through chip via configured to be formed in the semiconductor substrate to extend to a certain depth from the surface of the semiconductor substrate, an output pad, and a current path providing unit configured to provide a current, flowing between the semiconductor substrate and the through silicon via, to the output pad during a test mode. A first bias voltage may be applied to a first well region of the semiconductor substrate during the test mode, and the first bias voltage may be greater than a potential barrier between the semiconductor substrate and the through silicon via.

In accordance with another exemplary embodiment of the invention, an integrated circuit includes a semiconductor substrate configured to include a first well region and a second well region, the first well region being doped by a first impurity, and the second well region being doped by a second impurity different from the first impurity, a plurality of through silicon vias formed in the first well region, an output pad selectively coupled to each of the through silicon vias, and a current path providing unit configured to provide a current, flowing between the semiconductor substrate and a selected one of the plurality of through silicon vias, to the output pad during a test mode.

In accordance with yet another exemplary embodiment of the invention, an integrated circuit includes a semiconductor substrate, a through silicon via configured to be formed in the semiconductor substrate to extend to a certain depth from the surface of the semiconductor substrate, an output pad, a current forming unit configured to form a current between the semiconductor substrate and the through silicon via during a test mode, and a current path providing unit configured to provide the current formed by the current forming unit to the output pad, during the test mode.

DETAILED DESCRIPTION

Figure 1:
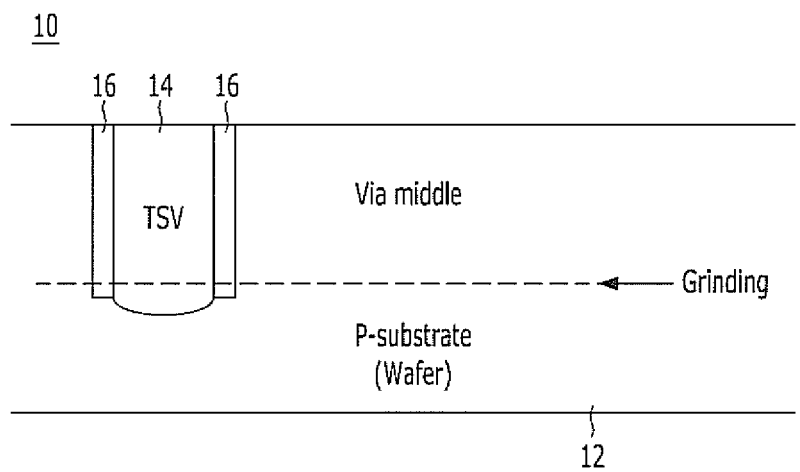
FIG. 1 is a cross-sectional view illustrating a related integrated circuit including a through silicon via (TSV).
Figure 2A:
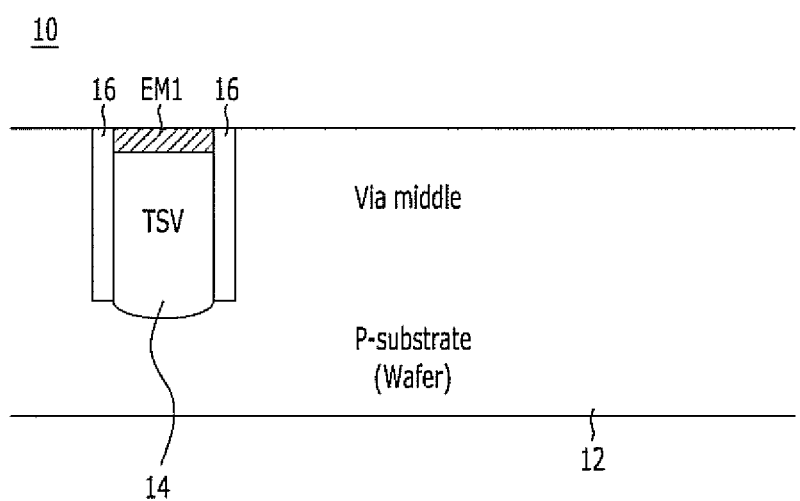
FIGS. 2A and 2B illustrate examples of defects occurring in the through silicon via (TSV) shown in FIG. 1.
Figure 2B:
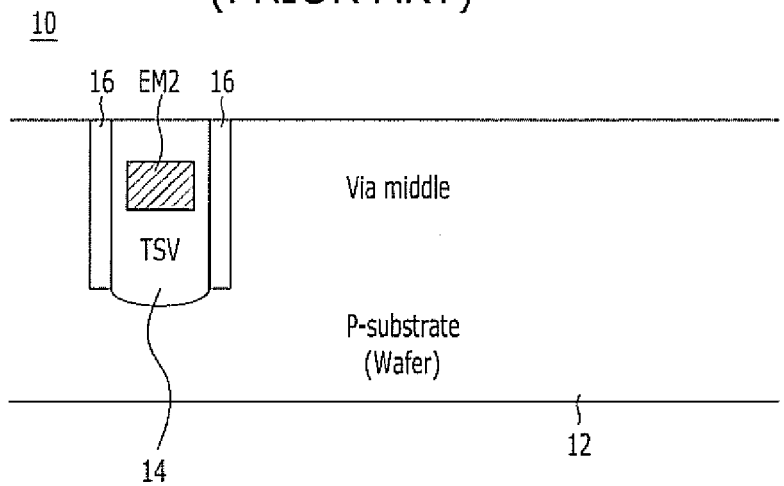

Exemplary embodiments of the invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
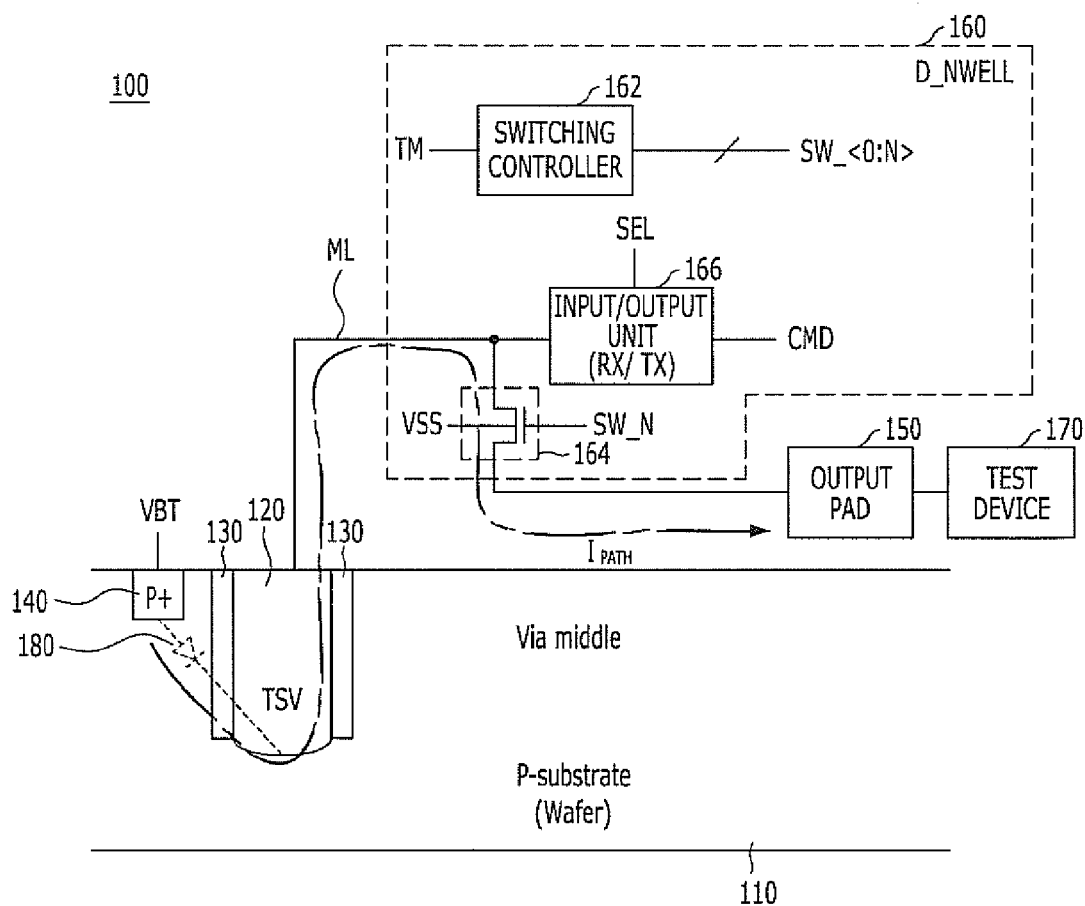
FIG. 3 illustrates an integrated circuit in accordance with an exemplary embodiment of the invention.

FIG. 3 illustrates an integrated circuit in accordance with an exemplary embodiment of the invention. In FIG. 3, only one through chip via is described, although a number of through chip vias may be included in the integrated circuit.

Referring to FIG. 3, an integrated circuit 100 comprises a semiconductor substrate 110, a through silicon via (TSV) 120, an isolation layer 130, a first well biasing region 140, and a current path providing unit 160. The semiconductor substrate 110 is doped by a first type (e.g., P-type) impurity. The TSV 120 is formed in a vertical direction by filling a hole that extends into the semiconductor substrate 110 to a predetermined depth from the surface of the semiconductor substrate 110. The isolation layer 130 surrounds sidewalls of the TSV 120 to isolate the TSV 120 from the semiconductor substrate 110. The first well biasing region 140 receives a bias voltage VBT to reduce a potential barrier (i.e., a schottky barrier) between the semiconductor substrate 110 and the TSV 120. The first well biasing region 140 may be a P-type well in the same semiconductor substrate 110 including the TSV 120. The current path providing unit 160 forms a current path $I_{PATH}$ and provides a current, flowing between the semiconductor substrate 110 and the TSV 120, to an output pad 150, which may be connected to a test device 170. The current path providing unit 160 provides the current through the current path $I_{PATH}$ in response to a test mode signal TM, which indicates a test mode of the integrated circuit 100. Furthermore, the integrated circuit 100 comprises a current forming unit 180 to form a current that flows from the semiconductor substrate 110 to the TSV 120 in response to the bias voltage VBT applied to the first well biasing region 140 during the test mode. The current forming unit 180 may be a schottky diode coupled between the semiconductor substrate 110 and the TSV 120.

The function of the TSV 120 is to interface signals (e.g., data signals), power, and so on. Accordingly, the TSV 120 may be a metal having a high conductivity, such as copper (Cu) or tantalum (Ta).

The first well biasing region 140 is doped with a high density of P-type impurities. The first well biasing region 140 receives the bias voltage VBT during the test mode, and receives a ground voltage VSS during a normal mode. The bias voltage VBT is a voltage greater than a potential barrier between the semiconductor substrate 110 and the TSV 120. For example, if the potential barrier between the semiconductor substrate 110 and the TSV 120 is about 0.679 V, the bias voltage VBT may be a power supply voltage VDD that is greater than 0.679 V. During the test mode, applying the bias voltage VBT to the first well biasing region 140 reduces a potential barrier between the semiconductor substrate 110 and the TSV 120 so that a current may flow between the semiconductor substrate 110 and the TSV 120. The operation of the integrated circuit 100 will be described hereinafter in more detail.

Figure 4:
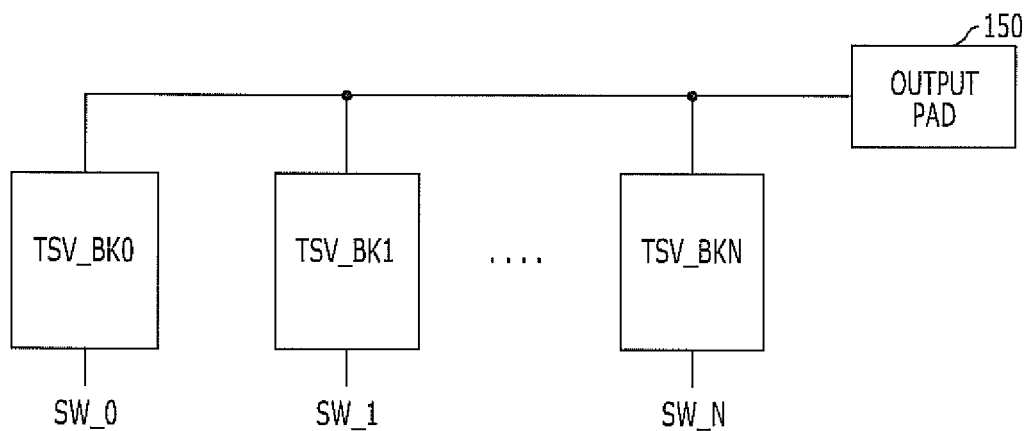
FIG. 4 is a block diagram illustrating a structure, including a plurality of through silicon vias (TSVs), switching units, and input/output units.

The current path providing unit 160 comprises a switching controller 162, a switching unit 164, and an input/output unit 166. The switching controller 162 generates a plurality of switching control signals SW_<0:N> sequentially enabled in response to the test mode signal TM. The switching unit 164 is electrically coupled between TSV 120 and the output pad 150 and switches on or off in response to a selected one SW_N of the plurality of switching control signals SW_<0: N>. The input/output unit 166 is disabled in response to an enable signal SEL during the test mode. Here, there is only one switching unit 164 since there is only one TSV 120. If there are a number of TSVs 120, then there will be a number of switching units 164 and input/output units 166. In this case, each of the plurality of switching control signals SW_<0:N> generated by the switching controller 162 is applied to a corresponding one of the plurality of switching units 164, as shown in FIG. 4. The current path providing unit 160 is formed in a second well region D_NWELL of the semiconductor substrate 110, which is doped with an N-type impurity. The second well region D_NWELL includes a second well biasing region (not shown) that receives the ground voltage VSS. By applying the ground voltage VSS to the second well biasing region, the second well region D_NWELL can be electrically separated from the semiconductor substrate 110, which receives the bias voltage VET. Hereinafter, the elements of the current path providing unit 160 will be described in more detail.

The switching controller 162 generates the plurality of switching control signals SW_<0:N> enabled sequentially in response to the test mode signal TM. The switching controller 162 may be implemented with a shift register or a decoder.

The switching unit 164 receives the selected one SW_N of the plurality of switching control signals SW_<0:N>. The switching unit 164 may be implemented with an NMOS transistor, which has a gate terminal receiving the selected one SW_N of the plurality of switching control signals SW_<0:N>, a drain terminal connected to the TSV 120 through a conductive line ML (e.g., a metal line), and a source terminal connected to the output pad 150.

The input/output unit 166 is disabled in response to the enable signal SEL, which is disabled during the test mode. The disabled input/output unit 166 does not have an effect on the current path $I_{PATH}$, which is formed during the test mode. The input/output unit 166 is enabled in response to the enable signal SEL, which is enabled during the normal mode. The enabled input/output unit 166 performs a signal receiving/transmitting operation. Particularly, the enabled input/output unit 166 receives a signal CMD received from the outside and transmits the signal CMD to the TSV 120. Also, the enabled input/output unit 166 receives a signal received from the TSV 120 and transmits the received signal to the outside. That is, the enabled input/output unit 166 performs a signal interfacing operation at the package level for the other stacked semiconductor chips.

Although not shown, the current path providing unit 160 may further include an output buffering unit between the switching unit 164 and the output pad 150.

FIG. 4 is a block diagram illustrating a structure, including a plurality of TSVs, switching units, and input/output units.

Referring to FIG. 4, a plurality of unit blocks TSV_BK0-TSV_BKN are commonly connected to the output pad 150. Each of the plurality of unit blocks TSV_BK0-TSV_BKN includes a TSV, an input/output unit, and a switching unit. The TSV, the input/output unit, and the switching unit included in each of the plurality of unit blocks TSV_BK0-TSV_BKN have a structure as shown in FIG. 3. That is, the TSV included in each of the plurality of unit blocks TSV_BK0-TSV_BKN is formed in a vertical direction by filling a hole in a semiconductor substrate 110 extending to a predetermined depth from the surface of the semiconductor substrate 110. The input/output unit, and the switching unit included in each of the plurality of unit blocks TSV_BK0-TSV_BKN are formed in the second well region D_NWELL of the semiconductor substrate 110, which is doped with an N-type impurity. Each of the plurality of unit blocks TSV_BK0-TSV_BKN is sequentially connected to the output pad 150 in response to the plurality of switching control signals SW_<0:N> generated by the switching controller 162.

Hereinafter, the operation of the integrated circuit 100 as shown in FIG. 3 will be described with reference to FIGS. 5A and 5B.

Figure 5A:
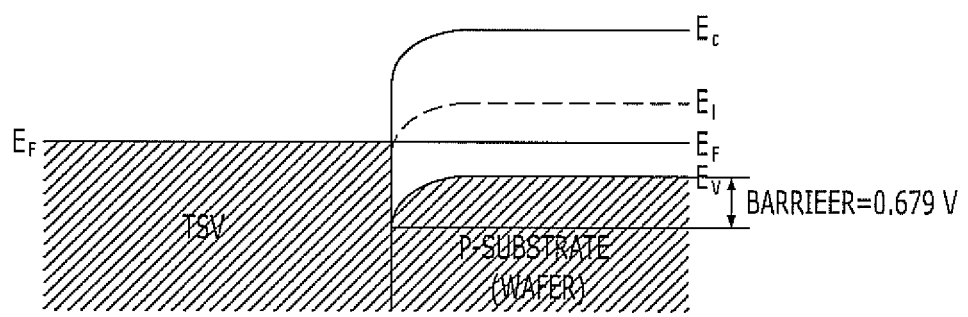
FIGS. 5A and 5B illustrate energy bands of a semiconductor substrate and a through silicon via (TSV).

FIG. 5A illustrates energy bands of the semiconductor substrate 110 and the TSV 120 of FIG. 3 during the normal mode. FIG. 5B illustrates energy bands of the semiconductor substrate 110 and the TSV 120 of FIG. 3 during the test mode.

As shown in FIG. 3, the current forming unit 180 is a parasitic schottky diode formed between the semiconductor substrate 110 and TSV 120 due to a semiconductor-metal junction.

In the normal mode, as shown in FIG. 5A, an interior potential barrier of about 0.679 V exists between the semiconductor substrate 110 and the TSV 120. In other words, although the Fermi level $E_F$ of the semiconductor substrate 110 is the same as that of the TSV 120, an energy band is deviated due to the difference of their work functions. Thus, the interior potential barrier exists between the semiconductor substrate 110 and the TSV 120. Due to the interior potential barrier, electrons of the TSV 120 cannot move toward the semiconductor substrate 110.

Figure 5B:
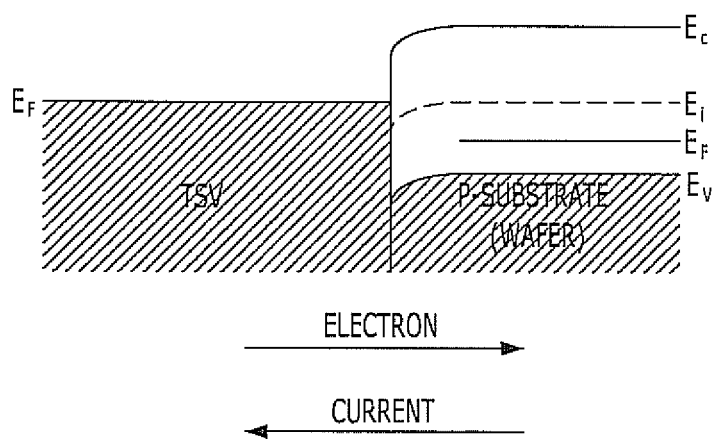

However, when the bias voltage VBT is applied to the first well biasing region 140, an energy band of the semiconductor substrate 110 is moved as shown in FIG. 5B. That is, the interior potential barrier between the semiconductor substrate 110 and the TSV 120 is reduced. Thus, electrons of the TSV 120 can move toward the semiconductor substrate 110 so that a current flow from the semiconductor substrate 110 to the TSV 120 is formed.

At this time, the current path providing unit 160 electrically connects the TSV 120 to the output pad 150 in response to the test mode signal TM, to form the current path $I_{PATH}$ between the TSV 120 and the output pad 150. More specifically, the switching controller 162 generates the plurality of switching control signals SW_<0:N> in response to the test mode signal TM. The switching unit 164 is turned on in response to the selected one SW_N of the plurality of switching control signals SW_<0:N> to connect between the conductive line ML connected to the TSV 120 and the output pad 150. At this time, since the input/output unit 166 is disabled in response to the enable signal SEL, the disabled input/output unit 166 does not have an effect on the current path $I_{PATH}$.

The test device 170 connected to the output pad 150 detects a current level or a voltage level based the current flow output through the output pad 150. When the detected level is greater than or equal to a predetermined level, it is determined that the TSV 120 is satisfactory. On the other hand, when the detected level is less than the predetermined level, it is determined that the TSV 120 is defected, and therefore, not satisfactory.

As shown in FIG. 4, where there are multiple TSVs 120, there are multiple conductive lines ML, switching units 164, and input/output units 166 corresponding to the multiple TSVs 120. In this case, the switching controller 162 generates the plurality of switching control signals SW_<0:N> sequentially during the test mode. Each of the plurality of switching units may be sequentially turned on in response to the plurality of switching control signals SW_<0:N> to provide a corresponding current path to the output pad 150. The test device 170 connected to the output pad 150 detects current levels or voltage levels sequentially based the current flow output through the output pad 150. Thus, it can be determined whether each of the TSVs is satisfactory or unsatisfactory.

As described above, exemplary embodiments of the present invention can detect the state of one or more TSVs at the wafer level. That is, before the package level, exemplary embodiments of the present invention can detect the state of a TSV to reduce manufacturing cost and time.

While the present invention has been described with respect to the specific embodiments, it will be apparent to those skilled in the art that various changes and modifications may be made without departing from the spirit and scope of the invention as defined in the following claims.

For example, in the exemplary embodiment of FIG. 3, although the semiconductor substrate is doped by a P-type impurity, it may be doped by an N-type impurity.

Also, although a test mode signal TM is applied to the switching controller 162 as shown in FIG. 3, a plurality of test mode signals may be applied.

Furthermore, although an input/output unit is required for the TSV 120 to transfer a signal such as a command, another circuit, which is more appropriate for transferring power through the TSV 120, may be implemented.

What is claimed is:
1. An integrated circuit comprising:
a semiconductor substrate;
a silicon via extending into the semiconductor substrate to a certain depth from the surface of the semiconductor substrate;
an output pad formed on the semiconductor substrate; and a current path providing unit, formed in the semiconductor substrate, configured to establish a current path and provide a current, flowing from the semiconductor substrate and through the silicon via, to the output pad during a test mode, wherein a first voltage is applied to a first well region of the semiconductor substrate during the test mode, the first voltage being greater than a schottky potential barrier formed at contact interface between a bottom of the silicon via and the semiconductor substrate.

2. The integrated circuit of claim 1, wherein the first well region of the semiconductor substrate receives a ground voltage, during a normal mode.

3. The integrated circuit of claim 1, wherein the current path providing unit is formed between the silicon via and the output pad, and is formed in a second well region, the second well region being doped by a second impurity different from a first impurity doping the first well region.

4. The integrated circuit of claim 3, wherein the second well region receives a second voltage different from the first voltage to electrically separate the first well region and the second well region during the test mode.

5. The integrated circuit of claim 1, further comprising an isolation layer configured to surround a sidewall portion of the silicon via, and isolate the silicon via from the semiconductor substrate.

6. The integrated circuit of claim 1, wherein the current path providing unit comprises a MOS transistor having its source terminal electrically coupled to the silicon via and its drain electrically coupled to the output pad, the MOS transistor turning on or off in response to a test mode signal indicating whether the integrated circuit is in the test mode or not.

7. The integrated circuit of claim 6, wherein the current path providing unit further comprises an input/output unit electrically coupled to the silicon via, the input/output unit configured to be enabled in a normal mode and disabled in the test mode.

8. The integrated circuit of claim 1, further comprising:

a current forming unit suitable for forming a current that flows from the semiconductor substrate to the silicon via in response to a bias voltage.

* * * * *